US012076910B2

(12) United States Patent
Sato (10) Patent No.: US 12,076,910 B2
(45) Date of Patent: Sep. 3, 2024

(54) FORMING APPARATUS AND ARTICLE MANUFACTURING METHOD (71) Applicant: CANON KABUSHIKI KAISHA, Tokyo (JP)

(72) Inventor: Takahiro Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/726,000

(22) Filed: Apr. 21, 2022

(65) Prior Publication Data
US 2022/0355534 A1 Nov. 10, 2022

(30) Foreign Application Priority Data

May 7, 2021 (JP) ................. 2021-079245

(51) Int. Cl.
G03F 7/00 (2006.01)
B29C 59/00 (2006.01)
B29C 59/02 (2006.01)
B29C 37/00 (2006.01)

(52) U.S. Cl.
CPC .......... B29C 59/026 (2013.01); B29C 59/002 (2013.01); G03F 7/0002 (2013.01); B29C 2037/90 (2013.01)

(58) Field of Classification Search
CPC ..................... B29C 59/026; G03F 7/0002
See application file for complete search history.

(56) References Cited

U.S. PATENT DOCUMENTS

| 10,018,909 | B2 | 7/2018 | Arai |
| 11,314,165 | B2* | 4/2022 | Yoshida ................ G03F 7/0002 |
| 2007/0114686 | A1 | 5/2007 | Choi et al. |
| 2016/0297136 | A1 | 10/2016 | Wakabayashi |
| 2020/0110333 | A1* | 4/2020 | Yoshida ................ B29C 33/424 |

FOREIGN PATENT DOCUMENTS

| JP | 5745129 B2 | 7/2015 |
| JP | 5824380 B2 | 11/2015 |

OTHER PUBLICATIONS

Office Action issued in U.S. Appl. No. 16/591,962, mailed Jul. 7, 2021.
Notice of Allowance issued in U.S. Appl. No. 16/591,962, mailed Jan. 20, 2022.
Office Action issued in Taiwanese Appln. No. 111115223 mailed Jun. 26, 2024. English translation provided.

* cited by examiner

Primary Examiner — S. Behrooz Ghorishi
Assistant Examiner — Alexander A Wang
(74) Attorney, Agent, or Firm — ROSSI, KIMMS & McDOWELL LLP

(57) ABSTRACT

A forming apparatus forms a formable material using a mold including a contact region to be brought into contact with the formable material on a substrate. The apparatus includes a controller configured to perform processing of bringing the contact region and the formable material on the substrate into contact with each other. The controller controls the processing so as to bring the mold and the substrate close to each other at a first relative speed and then bring the mold and the substrate close to each other at a second relative speed lower than the first relative speed, and controls switching from the first relative speed to the second relative speed so as to compensate a manufacturing error of the mold.

7 Claims, 11 Drawing Sheets

FORMING APPARATUS AND ARTICLE MANUFACTURING METHOD

BACKGROUND OF THE INVENTION

Field of the Invention

The present invention relates to a forming apparatus and an article manufacturing method.

Description of the Related Art

An imprint apparatus has been put into practice as one of mass production lithography apparatuses for semiconductor devices and the like. The imprint apparatus cures an imprint material supplied onto a substrate in a state in which the imprint material is in contact with a mold and separates the mold from the cured imprint material, thereby forming a pattern of the imprint material on the substrate. Currently, the imprint apparatus is required to further improve the throughput.

Japanese Patent No. 5745129 discloses driving control of a mold for improving the throughput. In Japanese Patent No. 5745129, before a mold comes into contact with an imprint material, the mold is driven at a high speed, and when the imprint material is filled into the pattern surface of the mold thereafter, the mold is driven at a low speed.

Japanese Patent No. 5824380 describes that when an imprint material on a substrate is filled into the pattern surface of a mold, a force applied to the mold to make the pattern surface of the mold a target shape is controlled based on the thickness information of the mold having a manufacturing error and a dimensional error.

As is described in Japanese Patent No. 5824380, a mold has a manufacturing error and a dimensional error. Therefore, due to individual differences in the thickness and expanding amount of the mold, an error occurs in the distance between the mold and the substrate. Then, when driving the mold at a high speed until the mold comes into contact with the imprint material as described in Japanese Patent No. 5745129, the mold can collide with the substrate at the high speed and be damaged. To the contrary, the contact between the pattern surface of the mold and the imprint material can be insufficient, resulting in slow filling and a decrease in throughput.

SUMMARY OF THE INVENTION

The present invention provides a technique advantageous in achieving both the throughput and the maintainability of a mold.

The present invention in its one aspect provides a forming apparatus that forms a formable material using a mold including a contact region to be brought into contact with the formable material on a substrate, the apparatus comprising a controller configured to perform processing of bringing the contact region and the formable material on the substrate into contact with each other, wherein the controller controls the processing so as to bring the mold and the substrate close to each other at a first relative speed and then bring the mold and the substrate close to each other at a second relative speed lower than the first relative speed, and controls switching from the first relative speed to the second relative speed so as to compensate a manufacturing error of the mold.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

The present invention is related to a forming apparatus that performs a forming process of forming a formable material made of a curable composition on a substrate. The forming process can include a supply step of discretely supplying droplets onto a substrate, and a contact step of bringing a formable material supplied onto the substrate into contact with a mold (original or template). The forming process can further include a curing step of curing the formable material in a state in which the formable material is in contact with the mold, and a separation step of separating the cured formable material from the mold.

Figure 1:
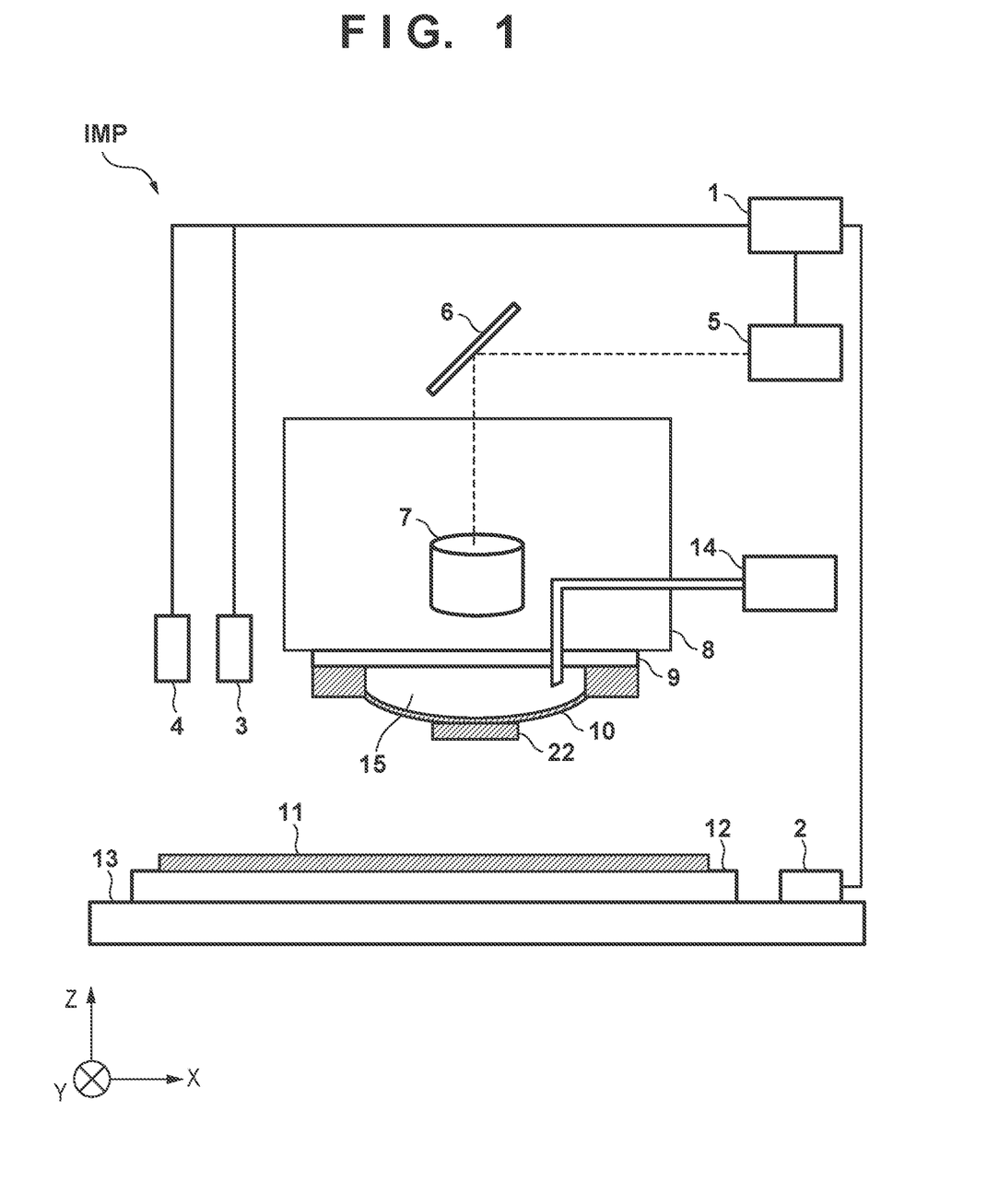
FIG. 1 is a view showing the arrangement of an imprint apparatus.

In this embodiment, an imprint apparatus as an example of the forming apparatus will be described. FIG. 1 is a view showing the arrangement of an imprint apparatus IMP according to the embodiment. In the specification and the drawings, directions will be indicated by an XYZ coordinate system in which the horizontal surface is set as the X-Y plane. In general, a substrate 11 serving as a substrate to be processed is placed on a substrate holder 12 such that the surface of the substrate 11 is parallel to the horizontal surface (X-Y plane). Therefore, in the following description, the directions orthogonal to each other in a plane along the surface of the substrate 11 are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the θX direction, the θY direction, and the θZ direction, respectively.

In FIG. 1, a mold 10 can be formed of quartz or the like that can transmit ultraviolet light. The mold 10 includes a pattern surface 22 with a pattern such as a circuit pattern formed on the surface facing the substrate 11. The pattern surface 22 is a contact region to be brought into contact with a formable material (imprint material) on a substrate. A mold holder 9 chucks and holds the mold 10 with a vacuum suction force or an electrostatic force. A controller 1 can be formed by at least one computer that includes a CPU and a memory. Further, the controller 1 can be connected to the respective components of the imprint apparatus via lines, and control operations, adjustments, and the like of the respective components of the imprint apparatus in accordance with programs stored in the memory.

The substrate 11 serving as an object of pattern formation by an imprint process is supported by the substrate holder 12. The substrate holder 12 chucks and holds the substrate 11 with a vacuum suction force or an electrostatic force. A measuring device 4 measures the position of the substrate 11 in the X and Y directions. The controller 1 can control the drive position of a substrate driver 13 based on the position of the substrate 11 in the X and Y directions measured by the measuring device 4. The substrate holder 12 (that is, the substrate 11) is driven in the X and Y directions by the substrate driver 13 such that a shot region on the substrate 11 comes below a supply apparatus (not shown). Then, the supply apparatus supplies a formable material (imprint material) onto the shot region.

As the material of the substrate 11, for example, glass, a ceramic, a metal, a semiconductor, a resin, or the like is used. A member made of a material different from the substrate may be provided on the surface of the substrate, as needed. The substrate 11 can be, for example, a silicon wafer, a compound semiconductor wafer, or silica glass.

The supply apparatus may collectively supply the imprint material for a plurality of shot regions, or may supply the imprint material for each shot region which is to be brought into contact with the mold in the imprint process. The imprint material may be supplied onto the substrate 11 in advance before the substrate 11 is loaded into the imprint apparatus IMP.

As the formable material (imprint material), a curable composition (to be also referred to as a resin in an uncured-state) that is cured by receiving curing energy is used. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The viscosity (the viscosity at 25° C.) of the imprint material is, for example, 1 mPa·s (inclusive) to 100 mPa·s (inclusive).

After the imprint material is supplied, the shot region serving as the target region of the imprint process is positioned below the mold 10 by the substrate driver 13. Then, the mold 10 is moved to the substrate 11 side (—Z direction) by a mold driver 8, and the mold 10 comes into contact with the imprint material on the shot region of the substrate 11. The relative speed at this time at which the mold 10 and the substrate 11 are brought close to each other until the mold 10 and the imprint material comes into contact with each other is referred to as a first relative speed. The first relative speed is not necessarily a single relative speed. A step after positioning of the substrate 11 below the mold 10 by driving of the substrate driver 13 to the start of contact between the mold 10 and the imprint material on the substrate 11 is referred to as a "contact step" or simply "contact" hereinafter.

The contact can be performed by driving the mold 10 in the −Z direction by the mold driver 8. Alternatively, the contact may be performed by driving the substrate 11 to the mold 10 side (+Z direction) by the substrate driver 13. Alternatively, the contact may be performed by both driving of the mold driver 8 and driving of the substrate driver 13. That is, in this embodiment, the mold driver 8 and the substrate driver 13 form a relative driving mechanism that relatively drives the mold holder 9 and the substrate holder 12 so as to change the spacing between the mold 10 and the substrate 11 in order to adjust the relative position between the mold 10 and the substrate 11.

The imprint apparatus IMP includes a deforming device 14 that deforms the pattern surface 22 into a convex shape toward the substrate 11 by applying a pressure to an air chamber 15 which is a space on the opposite side of the pattern surface 22 of the mold 10. The controller 1 can deform the shape of the mold 10 into a convex shape toward the substrate 11 side by controlling, using the deforming device 14, the pressure in the air chamber 15 between the mold 10 and the mold holder 9 when bringing the mold 10 and the imprint material on the substrate 11 into contact with each other. The purpose of this operation is to prevent air from entering the imprint material upon bringing the mold 10 and the imprint material on the substrate 11 into contact with each other. The controller 1 performs processing of bringing the pattern surface 22 and the imprint material on the substrate 11 into contact with each other while controlling the deformation of the pattern surface 22 by the deforming device 14. If air enters the imprint material, a failure in pattern formation due to unfilling can occur. It is conceivable to extend the filling waiting time to prevent such unfilling, but then the throughput is decreased. A case in which the pressure in the air chamber 15 is not controlled (the mold is not made convex) and a case in which the pressure in the air chamber 15 is controlled (the mold is made convex) will be described in the following embodiment.

After the mold 10 and the substrate 11 come into contact with each other, the mold driver 8 drives to the substrate 11 side (−Z direction) to increase the contact surface. This driving may be performed by the control based on the distance between the mold 10 and the substrate 11, or may be performed by the control based on the force received by the mold 10.

The pattern is transferred to the imprint material by sandwiching the imprint material between the pattern surface 22 of the mold 10 and the substrate 11. For this transfer, after the contact between the mold 10 and the imprint material on the substrate 11, the mold driver 8 is driven so as to spread the imprint material over the entire surface of the pattern surface 22. The relative speed (here, the driving speed of the mold driver 8) at which the mold 10 and the substrate 11 are brought close to each other is not necessarily a single relative speed, but they are brought close to each other at a second relative speed lower than the first relative speed used until the contact. This is because it is necessary to prevent entering of air upon spreading the imprint material over the entire surface of the pattern surface 22, and the driving at this time is fundamentally different from the driving just for moving the mold 10 in a space. A step after the start of contact between the mold 10 and the imprint material on the substrate 11 to spreading of the imprint material over the entire surface of the pattern surface 22 by advancing the contact is referred to as "pressing" hereinafter.

The pressure control of the air chamber 15 and the control of the mold driver 8 can be simultaneously performed so as to allow the entire surface of the pattern surface 22 to come into contact with the imprint material on the substrate 11.

As has been described above, the mold driver 8 and the substrate driver 13 form the relative driving mechanism that drives at least one of the substrate 11 and the mold 10 so as to adjust the relative position between the mold 10 (the pattern surface 22 thereof) and the substrate 11. The adjustment of the relative position by the relative driving mechanism includes driving for bringing the pattern surface 22 of the mold 10 into contact with the imprint material on the substrate 11 and driving for separating the pattern surface 22 from the cured product of the imprint material. The substrate driver 13 can be a driving mechanism having a plurality of degrees of freedom (for example, three axes of the X-axis, the Y-axis, and the θZ-axis, and preferably six axes of the X-axis, the Y-axis, the Z-axis, the θaxis, the θY-axis, and the θZ-axis). The mold driver 8 can also be a driving mechanism having a plurality of degrees of freedom (for example, three axes of the Z-axis, the θaxis, and the θY-axis, and preferably six axes of the X-axis, the Y-axis, the Z-axis, the θaxis, the θY-axis, and the θZ-axis).

Figure 2:
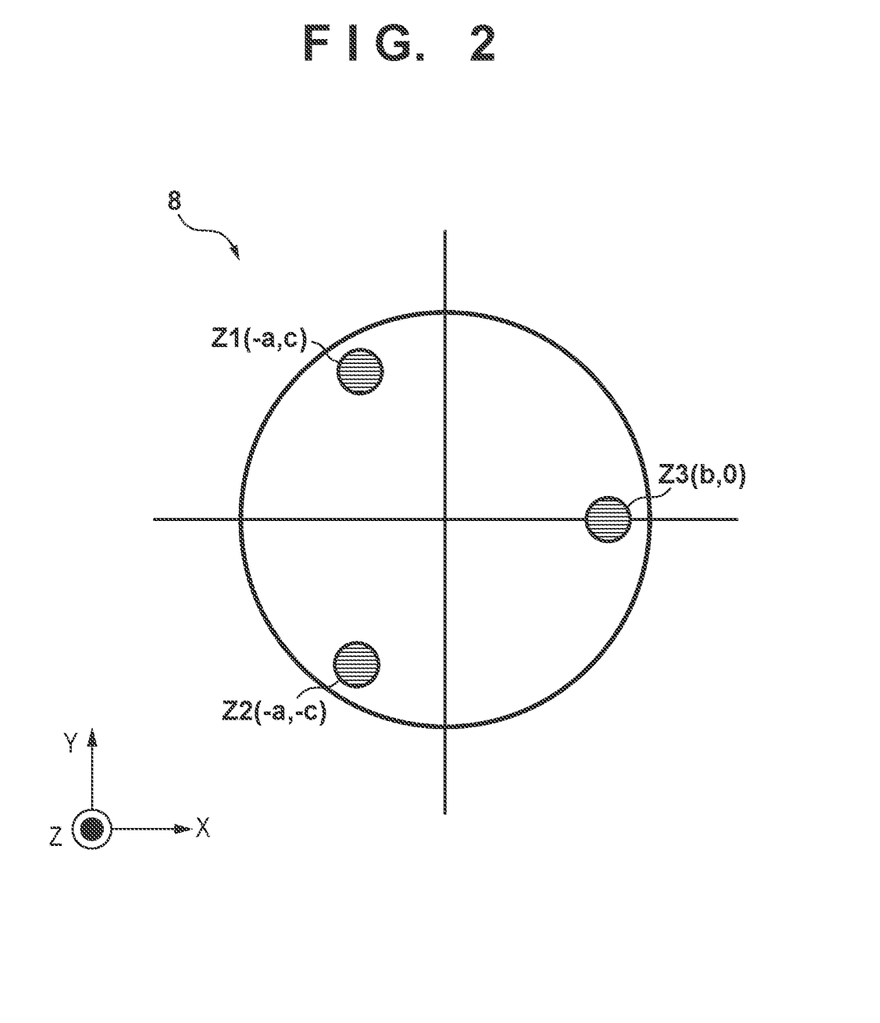
FIG. 2 is a view showing the arrangement of a mold driver.

As exemplarily shown in FIG. 2, the mold driver 8 can include three driving systems Z1, Z2, and Z3 that drive the mold holder 9 in the Z direction. Each of the driving systems Z1, Z2, and Z3 includes, for example, a sensor that detects the position in the Z-axis direction and the force acting in the Z direction. Based on outputs from these sensors, the position and posture of the mold 10 and the force applied to the mold 10 can be controlled.

For example, when the driving systems Z1 and Z2 push the mold 10 to the substrate 11 side (−Z direction) and the driving system Z3 pushes the mold 10 to the opposite side (+Z direction) of the substrate 11, the mold 10 can be tilted to the +X direction. By the control as described above, it is possible to perform posture control in accordance with the tilt of the pattern surface 22 of the mold 10 and the tilt and/or in-plane shape of the substrate 11.

After the imprint material spreads over the entire region of the pattern surface 22, curing energy is applied to the imprint material to cure the imprint material. The curing energy is generated by a light source 5, and applied to the imprint material via a beam splitter 6, a relay optical system 7, and the mold 10. In this specification, a step of curing the imprint material by light irradiation after the imprint material spreads over the entire region of the pattern surface 22 is referred to as "exposure" hereinafter.

Examples of the curing energy are an electromagnetic wave, heat, and the like. The electromagnetic wave is, for example, light selected from the wavelength range of 10 nm (inclusive) to 1 mm (inclusive), for example, infrared light, a visible light beam, or ultraviolet light.

After the imprint material is cured, the mold driver 8 is driven to the opposite side (+Z direction) of the substrate 11 to separate the pattern surface 22 of the mold 10 from the imprint material. With this, the pattern formation for one shot region is completed. In this specification, this step of separating the pattern surface 22 from the imprint material after the imprint material is cured is referred to as "mold releasing" hereinafter.

If there is another region supplied with the imprint material in the substrate 11, the substrate driver 13 is driven to position the region for next pattern formation below the mold 10, and pattern formation including contact, pressing, exposure, and mold releasing is performed. If there is no region supplied with the imprint material in the substrate 11, the imprint material is supplied to a new region. If there is no region for pattern formation in the substrate 11, the substrate 11 is unloaded from the substrate holder 12. A series of imprint processes is controlled by the controller 1.

Figure 3A:
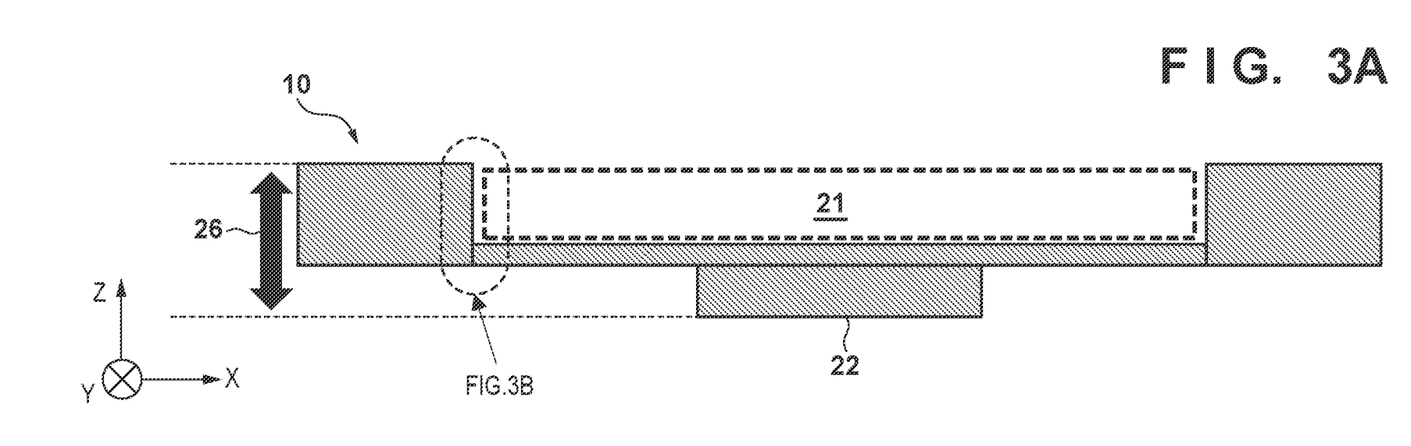
FIGS. 3A and 3B are views showing the structure of a mold.

Next, the structure of the mold 10 will be described. FIG. 3A is a sectional view showing the section of the mold 10 parallel to the X-Z plane. A cored-out portion 21 is a space to serve as the air chamber 15 shown in FIG. 1. A mold thickness 26 is the thickness from the surface held by the mold holder 9 to the pattern surface 22. The mold thickness 26 includes a dimensional error (manufacturing error) which occurs in the process of manufacturing, and this manufacturing error can cause an error in relative driving in the Z direction in the contact step.

Figure 3B:
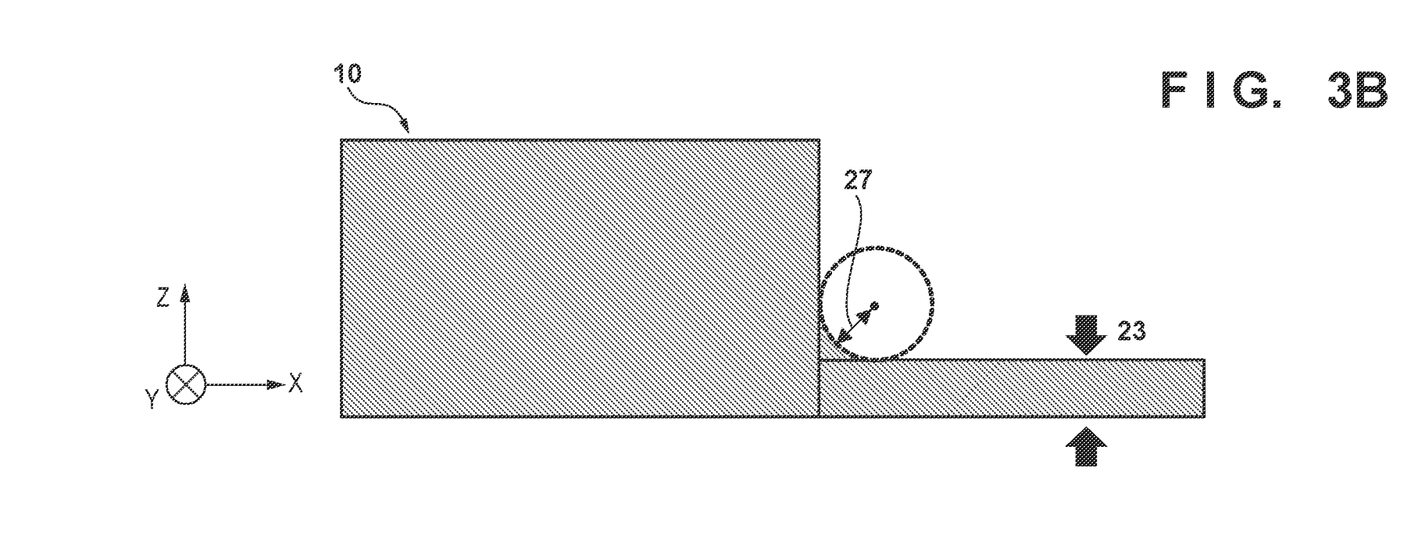

FIG. 3B is a view showing a portion of FIG. 3A in an enlarged scale. A cored-out portion thickness 23 is the thickness of the cored-out portion 21 excluding the pattern surface 22. A manufacturing error of the thickness can cause a convex amount error of the pattern surface 22 during performing the contact step while controlling the pressure in the air chamber 15. Even if the same positive pressure value is applied to the air chamber 15, the mold 10 having the smaller cored-out portion thickness 23 expands more easily, resulting in a larger convex amount. Similarly, a manufacturing error of a cored-out portion radius 27 can cause a convex amount error of the pattern surface 22. Even if the same positive pressure value is applied to the air chamber 15, since a region with the small cored-out portion thickness 23 increases as the cored-out portion radius 27 decreases, the mold 10 having the smaller cored-out portion radius 27 can expand more easily, resulting in a larger convex amount.

Figure 4A:
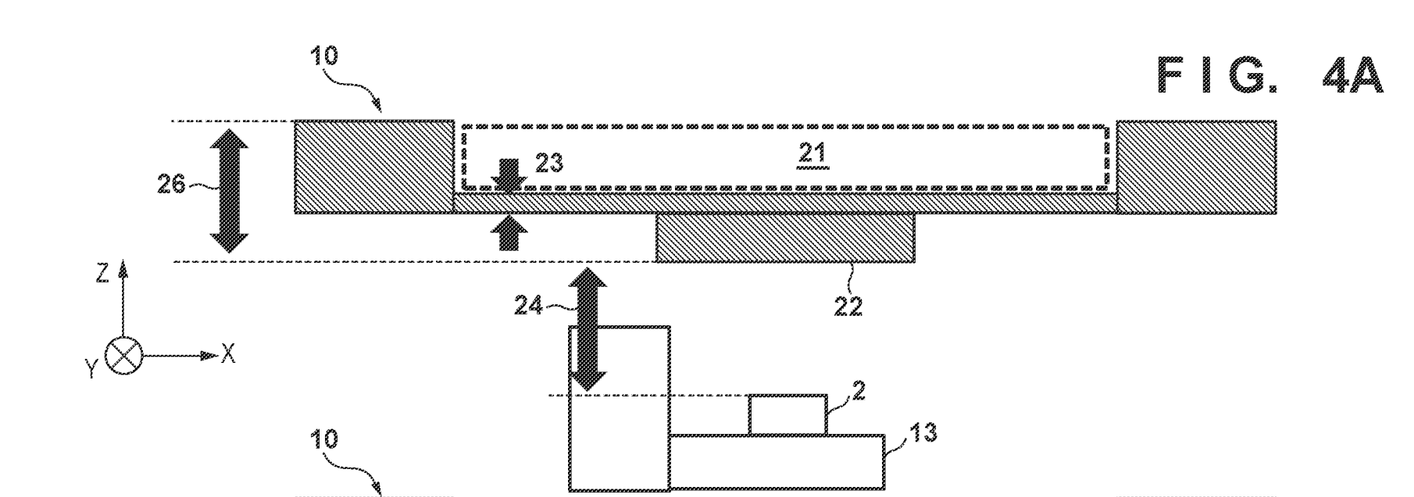
FIGS. 4A and 4B are views for explaining a method of measuring the expanding amount of the mold.
Figure 4B:
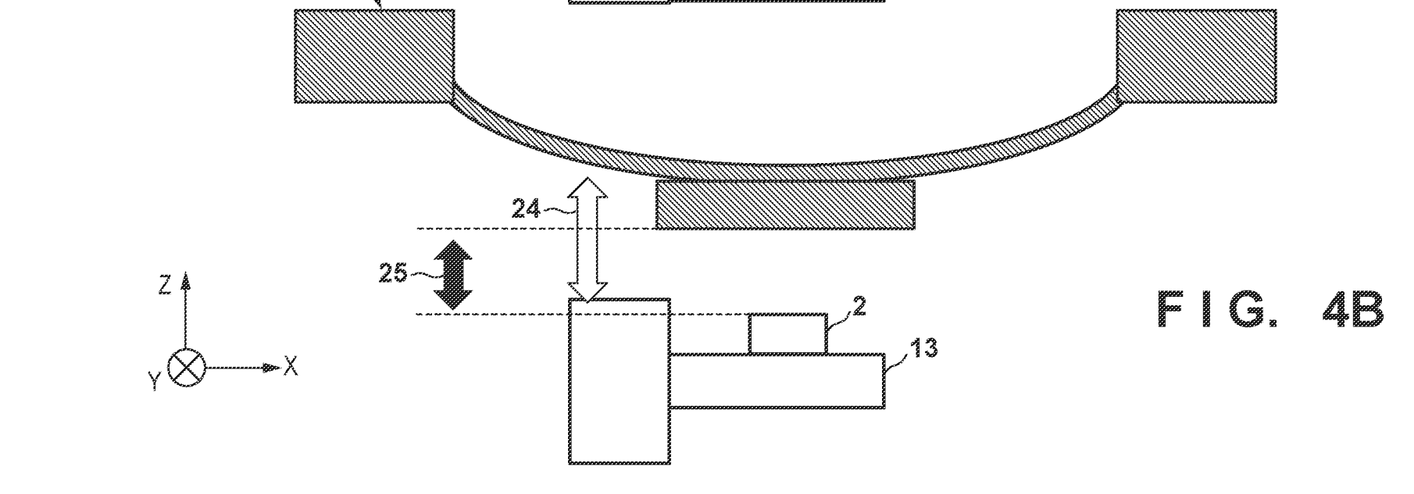

A method of obtaining the thickness and expanding amount of the mold 10 in the imprint process will be described. The imprint apparatus IMP can include a measuring device 2 that measures the height position of the contact region of the mold. In FIG. 1, the measuring device 2 is arranged on the substrate driver 13 and measures, as the height position, the Z-direction distance to the pattern surface 22 of the mold 10. Further, a measuring device 3 for measuring the Z-direction distance to the surface of the substrate 11 held by the substrate holder 12 is arranged above the substrate holder 12 and on the lateral side of the mold holder 9. FIG. 4A shows a state in which the mold 10 is held by the mold holder 9 and no pressure control is performed for the cored-out portion 21 (air chamber 15). In this state, the controller 1 drives the substrate driver 13 such that the measuring device 2 arranged on the substrate driver 13 comes below the pattern surface 22, and causes the measuring device 2 to measure the distance to the pattern surface 22 to obtain a Z position 24 before pressurization. Further, if contact is to be performed in a state in which the pressure in the air chamber 15 is controlled, the controller 1 controls the cored-out portion 21 (air chamber 15) of the mold 10 with the same pressure as in the imprint process to make the pattern surface 22 in a convex state, and causes the measuring device 2 to measure the distance to the pattern surface 22 to obtain a Z position 25 after pressurization. By obtaining the difference between the Z position 25 after pressurization and the Z position 24 before pressurization, the controller 1 can obtain the expanding amount of the mold 10 used in the imprint process.

It has been described above that in the imprint process, the mold 10 is driven in the Z direction by the mold driver 8, and the manufacturing errors of the mold thickness 26, the cored-out portion thickness 23, and the cored-out portion radius 27 are related to the Z-direction error of the mold. Based on this, an adjustment method in the contact step will be described.

Figure 5A:
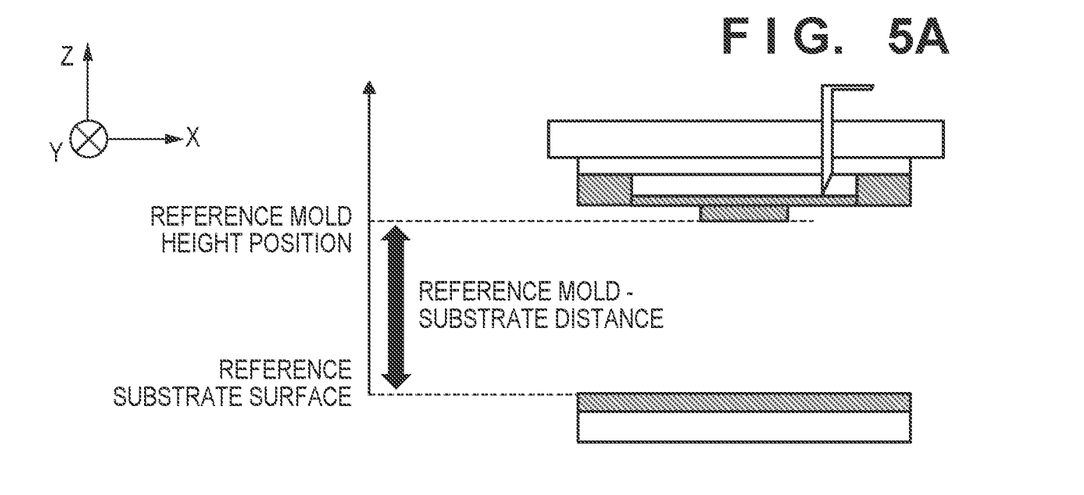
FIGS. 5A to 5C are views for explaining a procedure for obtaining the reference driving amount of the mold driver.
Figure 5B:
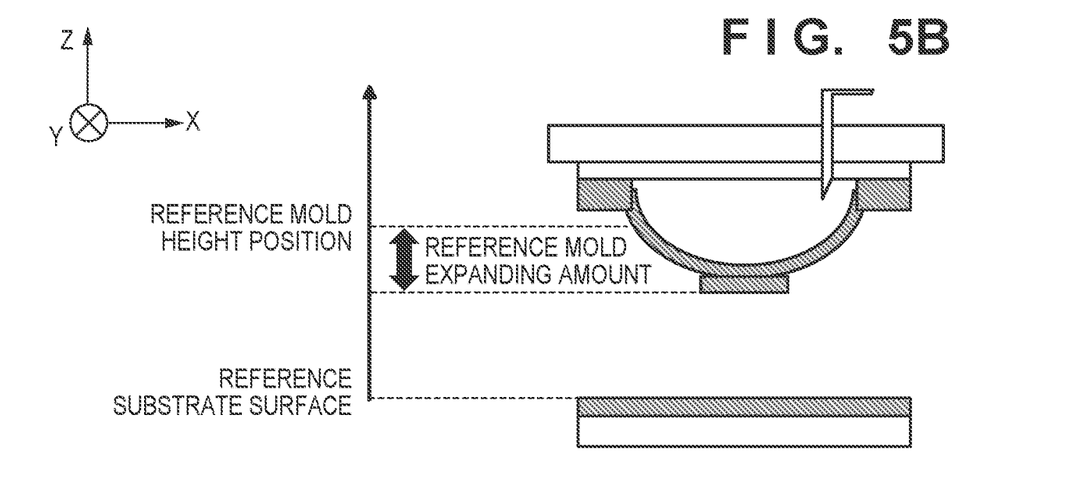
Figure 5C:
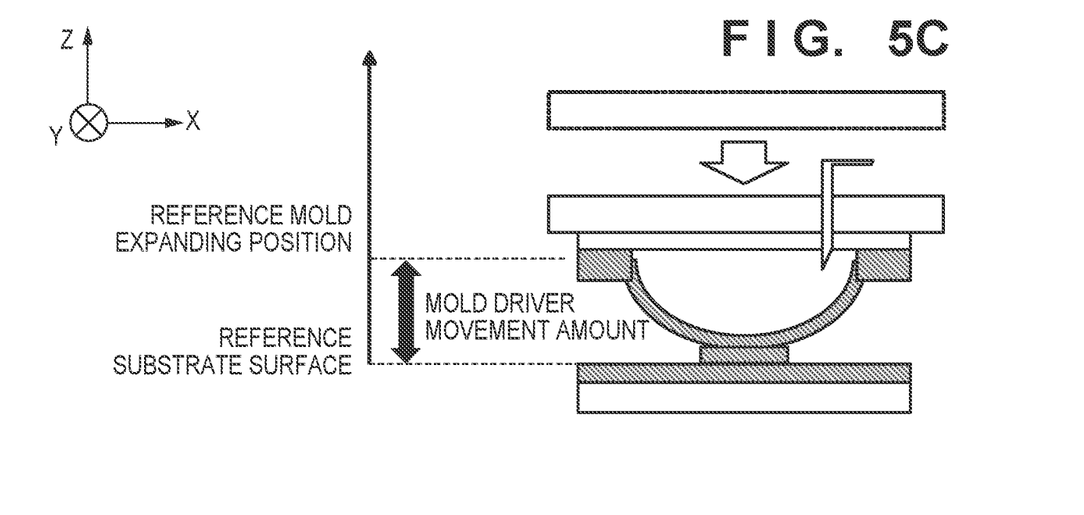

FIGS. 5A to 5C show the adjustment upon determining the driving amount of the mold driver 8 in the contact step. For this adjustment, a mold (reference mold GM) serving as a reference and a substrate (reference substrate GS) each of which has no manufacturing error or a known manufacturing error. In FIG. 5A, the reference mold GM and the reference substrate GS are held by the mold holder 9 and the substrate holder 12, respectively. The controller 1 drives the substrate driver 13 such that the measuring device 2 is located below a pattern surface 22' of the reference mold GM, and causes the measuring device 2 to measure the distance to the pattern surface 22'. Then, the controller 1 drives the substrate driver 13 such that the reference substrate GS is located below the measuring device 3, and causes the measuring device 3 to measure the distance to the surface of the reference substrate GS. Based on these measurement results, the controller 1 performs correction driving by the mold driver 8 such that the pattern surface 22' of the reference mold GM and the reference substrate GS face parallel to each other as in the imprint process. If pressure control for the air chamber 15 is to be performed, the controller 1 also applies a pressure to the air chamber 15 of the reference mold GM as shown in FIG. 5B. Here, the pressure applied to the reference mold GM is, for example, the maximum pressure used in the imprint process. The pressure is applied, and the measuring device 2 measures the expanding amount of the reference mold GM. In FIG. 5C, the controller 1 drives the mold driver 8 to the reference substrate GS side (—Z direction) such that the relative speed to bring the reference mold GM and the reference substrate GS close to each other becomes the second relative speed lower than the first relative speed. The controller 1 drives the mold driver 8 until a portion of the reference mold GM and a portion of the reference substrate GS come into contact with each other, and stores the driving amount at the time of the contact as the reference driving amount of the mold driver 8.

Figure 6A:
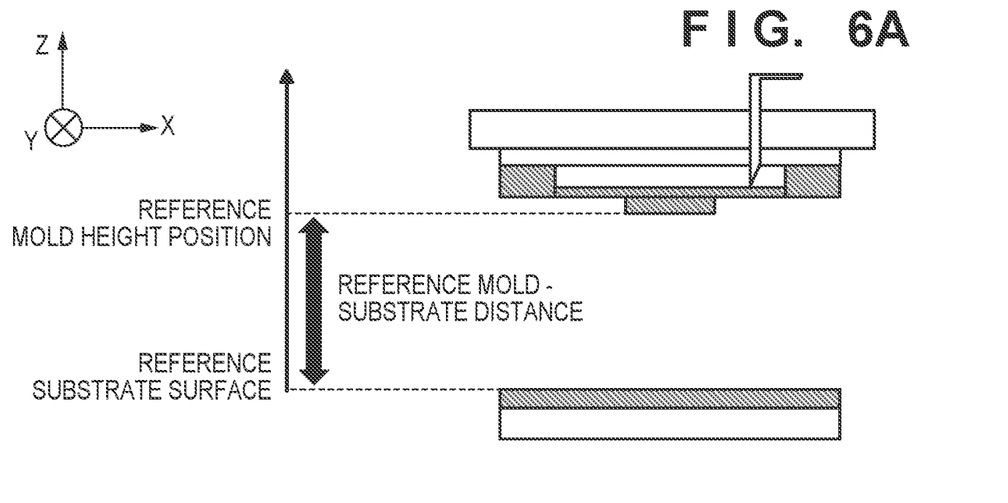
FIGS. 6A to 6C are views for explaining a harmful effect in a case in which a mold thinner than a reference mold is used.
Figure 6B:
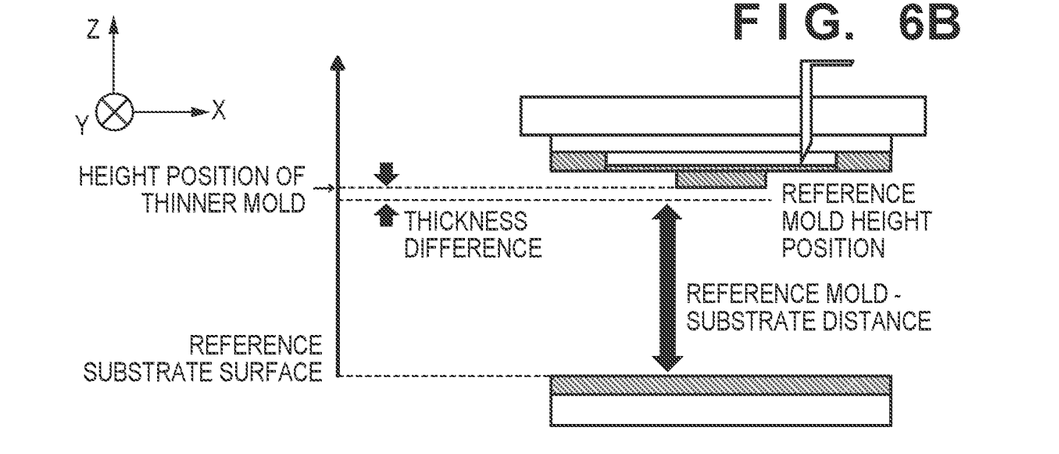
Figure 6C:
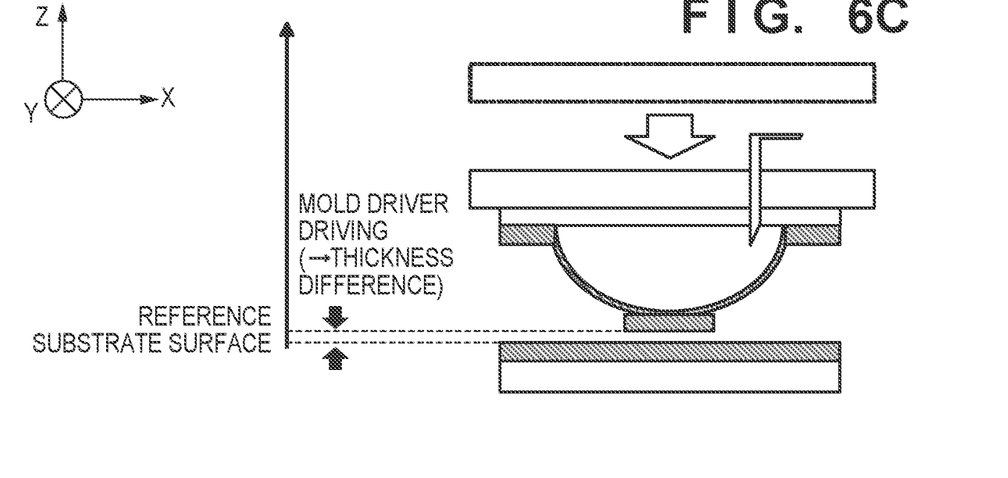

Next, with reference to FIGS. 6A to 6C, the specific influence of the Z-direction error caused by the manufacturing error of the mold 10, which occurs during the contact using the reference driving amount of the mold driver 8 described with reference to FIGS. 5A to 5C, will be described. FIG. 6A shows the same state as in FIG. 5A, in which the reference mold GM and the reference substrate GS are mounted. To the contrary, in FIG. 6B, the reference mold GM is replaced with the mold 10. Here, the mold thickness 26 of the mold 10 is smaller than that of the reference mold GM. As shown in FIG. 6C, if the imprint process is performed using the reference driving amount and the mold 10, since the mold thickness 26 of the mold 10 is small, the driving amount is insufficient for proper contact with the imprint material on the substrate 11. Accordingly, the mold driver 8 is lowered slowly such that the relative speed at which the mold 10 and the reference substrate GS are brought close to each other becomes equal to or lower than the first relative speed, and this can cause a decrease in throughput.

Figure 7A:
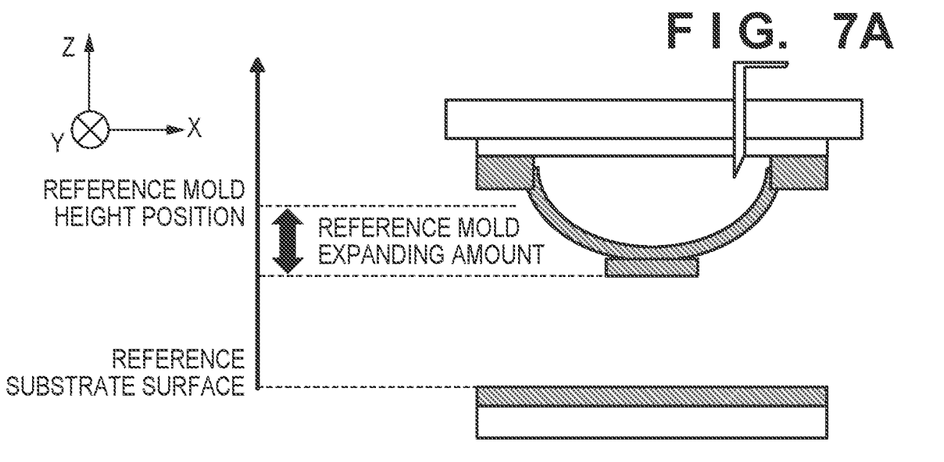
FIGS. 7A to 7C are views for explaining a harmful effect in a case in which a mold having a larger expanding amount than the reference mold is used.
Figure 7B:
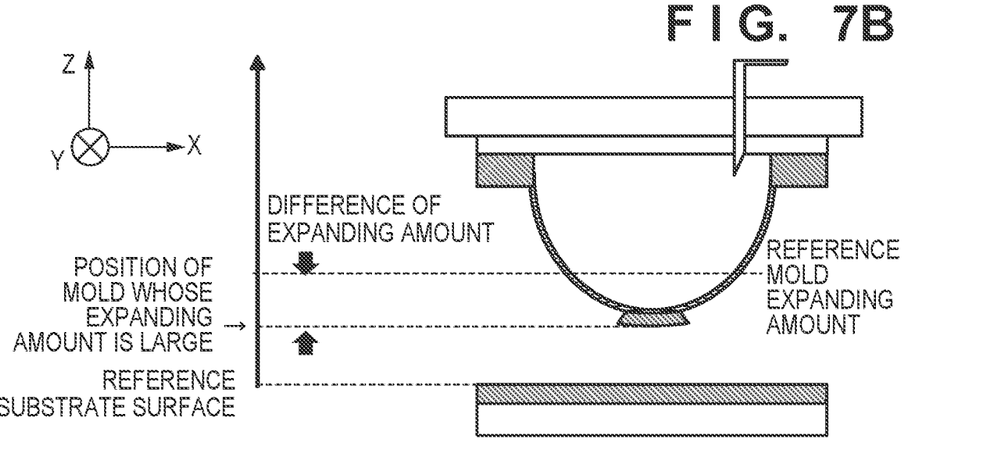
Figure 7C:
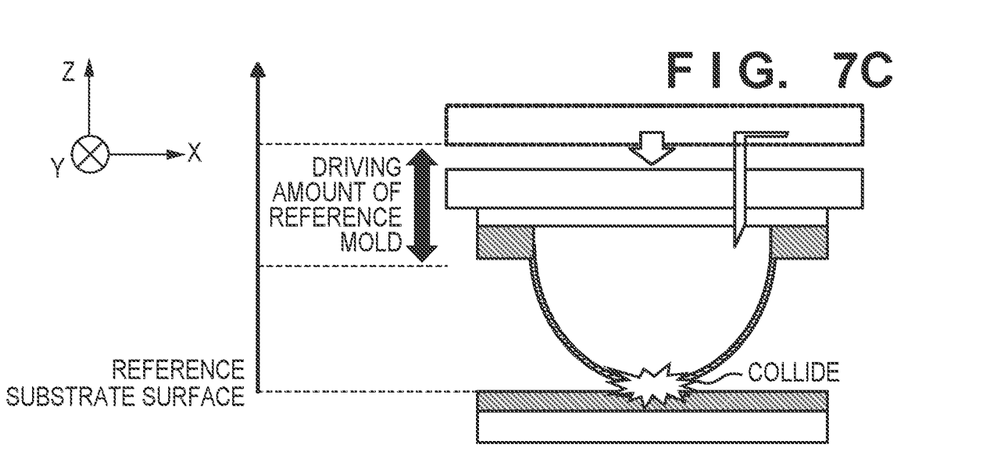

As has been described above, there are the manufacturing error of the cored-out portion thickness 23 and the manufacturing error of the cored-out portion radius 27 other than the manufacturing error of the mold thickness 26. With reference to FIGS. 7A to 7C, the specific influence of the Z-direction error caused by the manufacturing errors of the cored-out portion thickness 23 and the cored-out portion radius 27 of the mold 10, which occurs during the contact using the reference driving amount of the mold driver 8 described with reference to FIGS. 5A to 5C, will be described. FIG. 7A shows the same state as in FIG. 5B, in which the reference mold GM and the reference substrate GS are mounted and a pressure is applied to the air chamber 15 of the reference mold GM. To the contrary, FIG. 7B shows a state in which the reference mold GM is replaced with the mold 10 and the same pressure as in FIG. 7A is applied to the air chamber 15. Here, the cored-out portion thickness 23 of the mold 10 is smaller than that of the reference mold GM due to the manufacturing error. Since the cored-out portion thickness 23 is smaller, the expanding amount of the mold 10 is larger than that of the reference mold GM. As shown in FIG. 7C, if the imprint process is performed using such the mold 10 and the reference driving amount, the driving amount is to large for the mold 10 since the expanding amount of the mold 10 is large, so that the pattern surface 22 collides with the substrate 11 and the mold 10 or the substrate 11 may be damaged. This also applies to a case in which the cored-out portion radius 27 is small due to the manufacturing error.

Figure 8A:
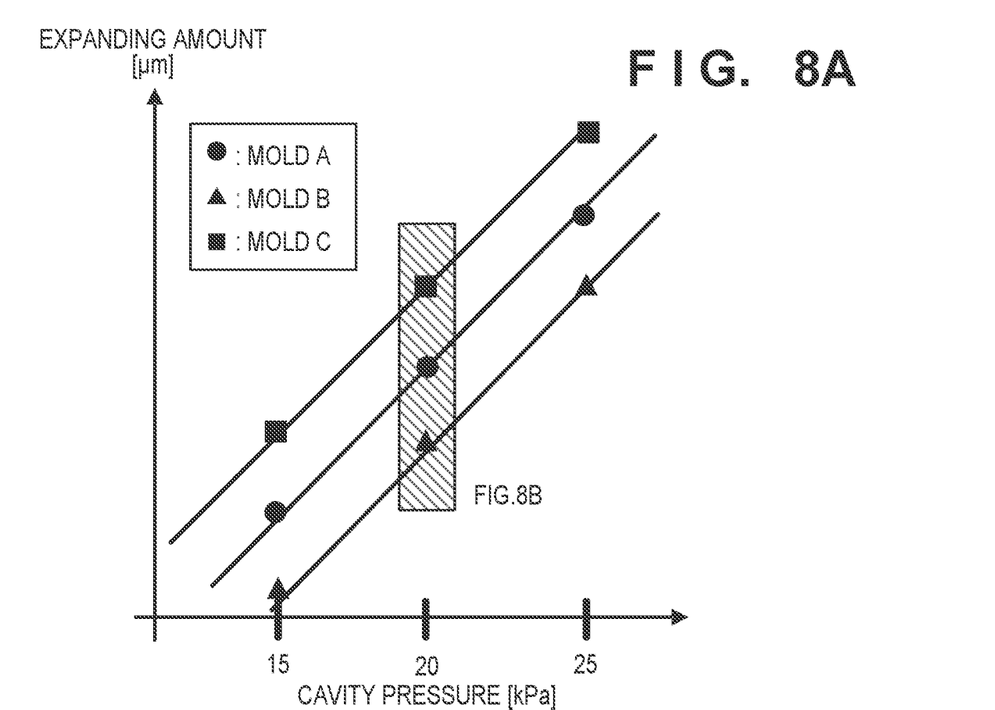
FIGS. 8A and 8B are graphs for explaining characteristics of the expanding amount of a mask.
Figure 8B:
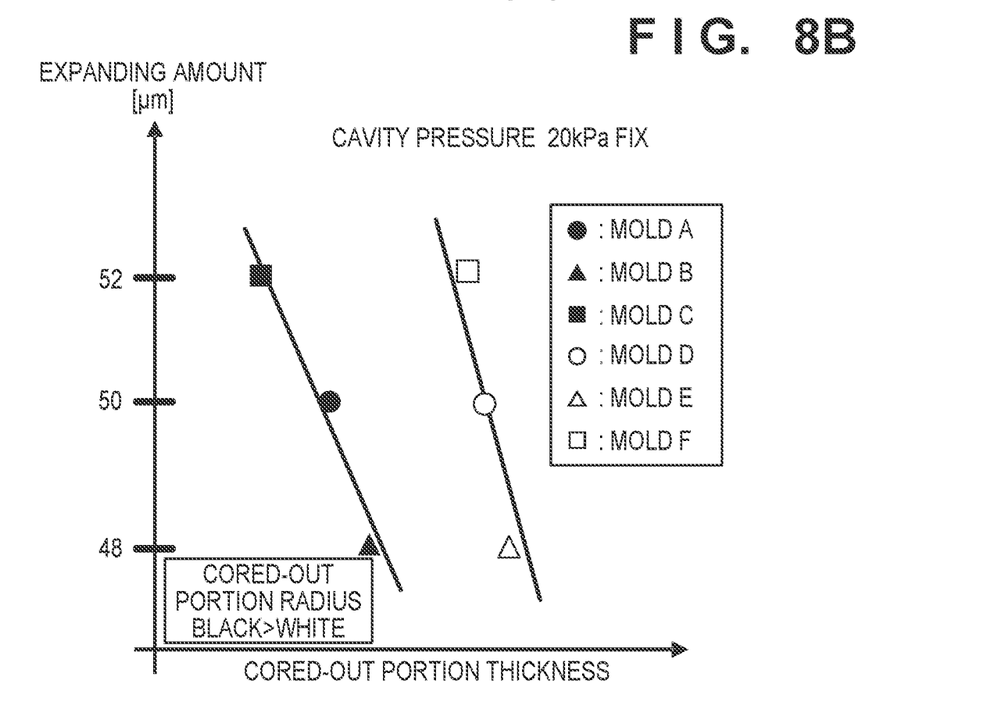

Each of FIGS. 8A and 8B exemplarily illustrates the relationship obtained in advance between the pressure from the deforming device 14 and the deformation amount for each of a plurality of molds. FIG. 8A illustrates the tendency regarding the pressure and the expanding amount upon applying a pressure to the air chamber 15 (cavity) of the mold 10. The abscissa represents the pressure value applied to the cored-out portion 21 of the mold 10, which corresponds to the air chamber 15 in the imprint process, and the ordinate represents the expanding amount (the Z position 25 after pressurization—the Z position 24 before pressurization) of the mold 10 at that time. Since the region where the pressure value used in the imprint process has a linear relationship with the expanding amount is often used, the approximate expanding amount characteristic of the mold 10 can be grasped by obtaining data of the pressure value/the expanding amount at two points. There are individual differences in the linear slope and intercept among molds A, B, and C in FIG. 8A.

FIG. 8B illustrates the relationship between the slope difference among the three molds shown in FIG. 8A and the manufacturing error. The abscissa represents the cored-out portion thickness 23 of each mold, and the ordinate represents the expanding amount (the Z position 25 after pressurization—the Z position 24 before pressurization) of each mold. The pressure value applied to the air chamber 15 of the mold 10 at this time is constant. Further, FIG. 8B also illustrates the relationship among the expanding amounts of respective molds (molds D, E, and F) when the abscissa represents the cored-out portion radius 27 of the respective molds. The difference in expanding amount illustrated in FIG. 8A is caused by the manufacturing errors of the mold thickness 26, the cored-out portion thickness 23, and the cored-out portion radius 27 described above.

With reference to FIGS. 8A and 8B, it has been described above that there are multiple factors for the expanding amount of the mold 10. Next, the operation of the difference in expanding amount among the molds in the actual imprint process will be described. In the following description, the controller 1 controls switching from the first relative speed to the second relative speed based on the difference between the height position of the pattern surface 22 of the mold 10 measured by the measuring device 2 and the height position of the contact region of the reference mold SM, whose manufacturing error is known, measured by the measuring device 2.

Figure 9A:
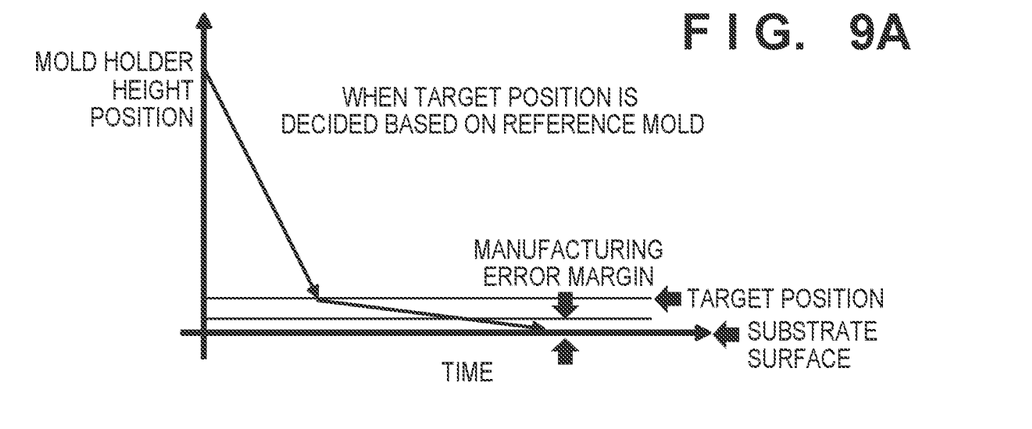
FIGS. 9A to 9C are graphs for explaining a method of correcting the driving amount of the mold driver.
Figure 9B:
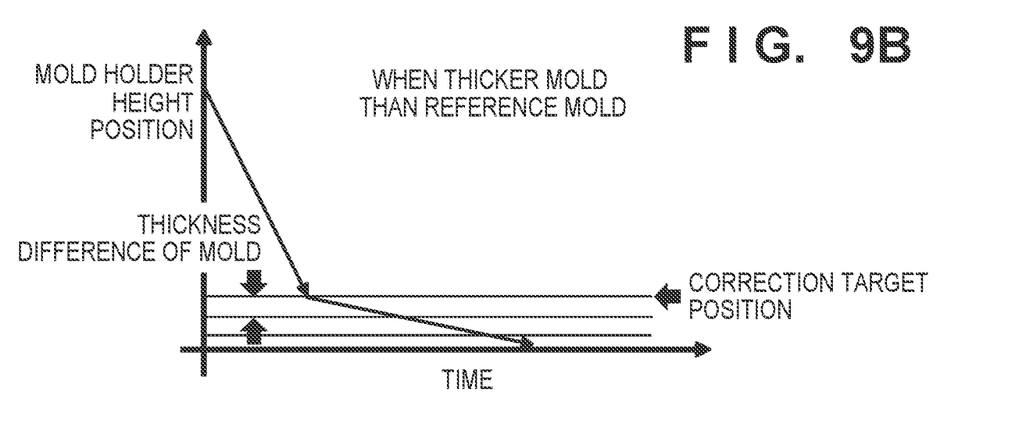
Figure 9C:
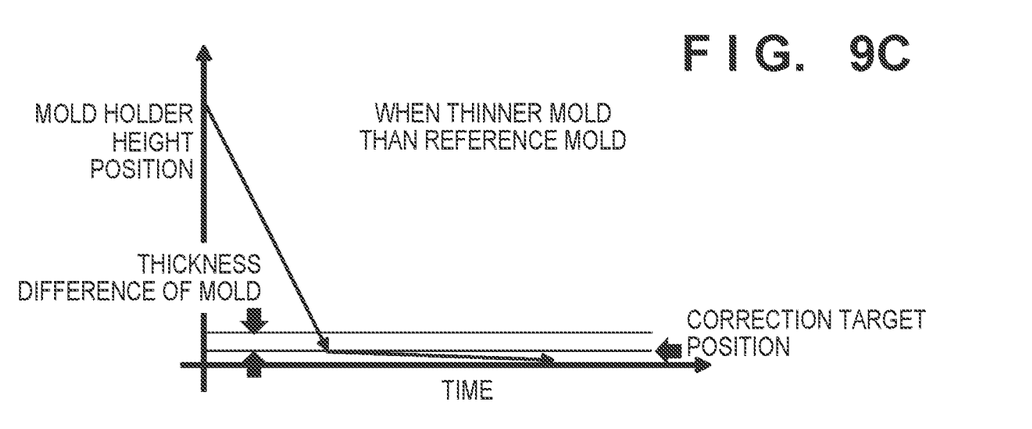

With reference to FIGS. 9A to 9C, a method of correcting the driving amount of the mold driver 8 in the imprint process in which the pressure in the air chamber 15 is not controlled (the mold is not made convex) will be described. In FIGS. 9A to 9C, the abscissa represents the time to contact and pressing in the imprint process, and the ordinate represents the position of the mold holder 9 in the Z direction. The origin of the ordinate indicates a state in which the entire surface of the pattern surface 22 of the mold 10 is completely in contact with the imprint material. FIG. 9A shows a case in which the reference mold GM is used intact in the imprint process. When the reference mold GM is used, the mold driver 8 can be driven at the first relative speed until the contact without correcting the reference driving amount, so there is no decrease in throughput. FIG. 9B shows a case in which the mold 10 having the larger mold thickness 26 than the reference mold GM is used. In this case, the controller 1 decides a corrected target position based on the driving amount obtained by subtracting, from the reference driving amount, the difference between the Z position 24 before pressurization of the reference mold GM and the Z position 24 before pressurization of the mold 10. The controller 1 brings the mold 10 and the substrate 11 close to each other at the first relative speed until the corrected target position. This can prevent a collision between the mold 10 and the substrate 11. Then, the controller 1 further brings the mold 10 and the substrate 11 close to each other at the second relative speed lower than the first relative speed. FIG. 9C shows a case in which the mold 10 having the smaller mold thickness 26 than the reference mold GM is used. The controller 1 decides a corrected target position based on the driving amount obtained by adding, to the reference driving amount, the difference between the Z position 24 before pressurization of the mold 10 and the Z position 24 before pressurization of the reference mold GM. The controller 1 brings the mold 10 and the substrate 11 close to each other at the first relative position until the corrected target position. This can prevent a decrease in throughput caused by early switching to the second relative speed lower than the first relative speed. Then, the controller 1 further brings the mold 10 and the substrate 11 close to each other at the second relative speed lower than the first relative speed.

The controller 1 can store, as the parameter for each mold, the difference between the mold thickness 26 of each mold and the mold thickness 26 of the reference mold GM. Accordingly, the imprint process can be performed with the highest throughput for each mold without performing measurement by the measuring device 2 after the first measurement. Of course, the measurement may be performed every time in consideration of the possibility that the respective parts may change with time.

It has been described above that the difference between molds in the contact can be absorbed by adding/subtracting the difference in the mold thickness 26 to/from the reference driving amount. Next, with reference to FIGS. 10A to 10C, a method of correcting the driving amount of the mold driver 8 in the imprint process in which the pressure in the air chamber 15 is controlled (the mold is made convex) will be described. Although not described in FIGS. 10A to 10C, addition/subtraction of the difference in the mold thickness 26 to/from the reference driving amount as described above is also performed in this method. Here, correction of the difference in expanding amount (deformation amount) alone will be mentioned.

Figure 10A:
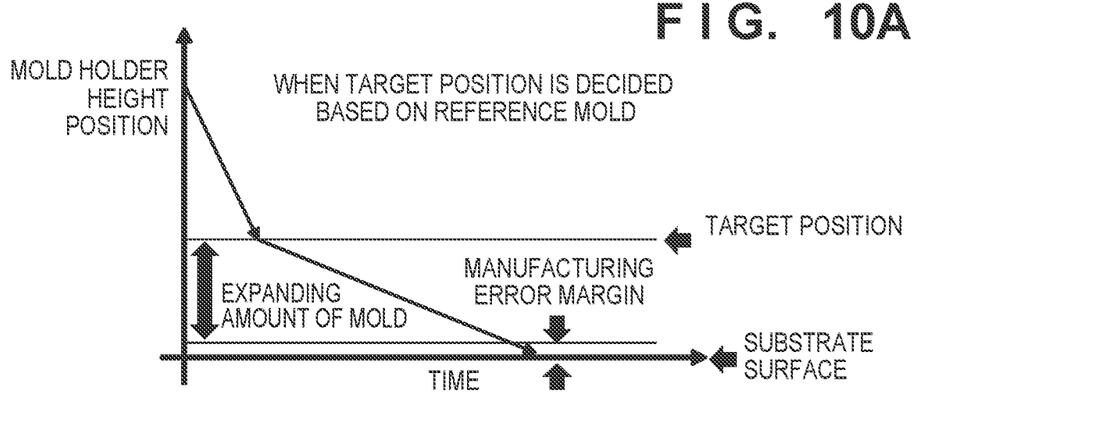
FIGS. 10A to 10C are graphs for explaining a method of correcting the driving amount of the mold driver.
Figure 10B:
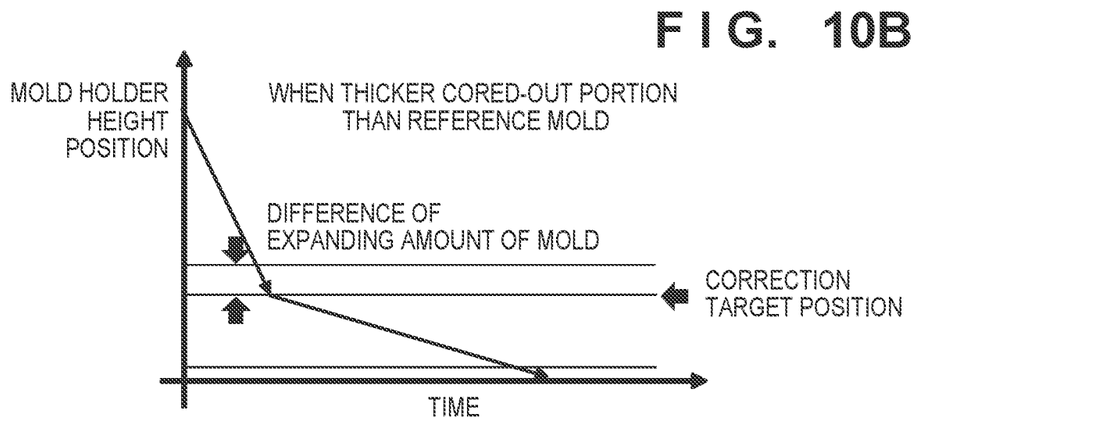
Figure 10C:
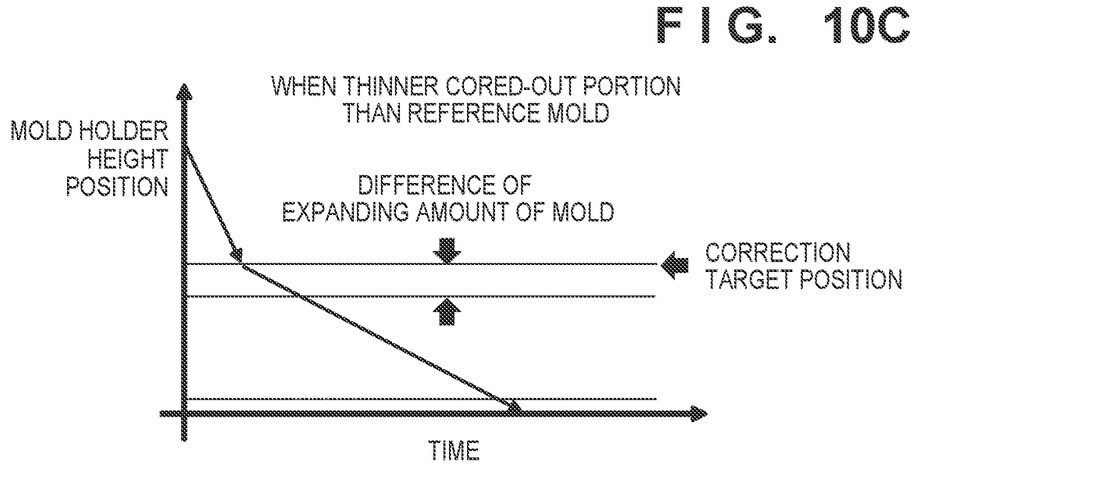

Each of FIGS. 10A to 10C shows the method of correcting the driving amount of the mold driver 8 in the imprint process in which the pressure in the air chamber 15 is controlled (the mold is made convex). In FIG. 10A to 10C, the abscissa represents the time and the ordinate represents the position in the Z direction as in FIGS. 9A to 9C. The origin of the ordinate indicates a state in which the entire surface of the pattern surface 22 of the mold 10 is completely in contact with the imprint material. FIG. 10A shows a case in which the reference mold GM is used intact in the imprint process. When the reference mold GM is used, the mold driver 8 can be driven at the first relative speed until the contact without correcting the reference driving amount, so there is no decrease in throughput. FIG. 10B shows a case in which the mold 10 is used, which has the larger cored-out portion thickness 23 than the reference mold GM so that the expanding amount of the pattern surface 22 is smaller than that of the reference mold GM even if the same pressure value is applied. In this case, the controller 1 decides a corrected target position based on the driving amount obtained by adding, to the reference driving amount, the difference between the expanding amount of the reference mold GM and the expanding amount of the mold 10. The controller 1 brings the mold 10 and the substrate 11 close to each other at the first relative speed until the corrected target position. This can prevent a decrease in throughput caused by early switching to the second relative speed lower than the first relative speed. Then, the controller 1 brings the mold 10 and the substrate 11 close to each other at the second relative speed lower than the first relative speed. FIG. 10C shows a case in which the cored-out portion thickness 23 is smaller than that of the reference mold GM so that the expanding amount of the mold is larger than that of the reference mold GM even with the same pressure value. In this case, the controller 1 decides a corrected target position based on the driving amount obtained by subtracting, from the reference driving amount, the difference between the expanding amount of the reference mold GM and the expanding amount of the mold 10. The controller 1 brings the mold 10 and the substrate 11 close to each other at the first relative speed until the corrected target position. This can prevent a collision between the mold 10 and the substrate 11. Then, the controller 1 further brings the mold 10 and the substrate 11 close to each other at the second relative speed lower than the first relative speed.

The controller 1 stores the expanding amount of the reference mold GM obtained when the reference driving amount is decided using the reference mold GM. Only when each mold is used for the first time, the controller 1 obtains the relationship (intercept and slope) between the pressure in the air chamber 15 and the expanding amount before performing the imprint process, and stores the relationship as the parameter for each mold. During the imprint process, the controller 1 corrects the target position or the reference driving amount based on the pressure condition of the air chamber 15 in use and the stored relationship. Accordingly, the imprint process can be performed with the highest throughput for each mold without performing measurement by the measuring device 2 after the first measurement. Of course, the measurement may be performed every time in consideration of the possibility that the respective parts may change with time.

In the embodiment described above, the controller 1 controls processing regarding contact and pressing so as to bring the mold 10 and the substrate 11 close to each other at the first relative speed and then bring the mold 10 and the substrate 11 close to each other at the second relative speed lower than the first relative speed. Here, the controller 1 controls switching from the first relative speed to the second relative speed so as to compensate the manufacturing error of the mold 10. By performing the appropriate switching, it is possible to prevent a collision between the mold 10 and the substrate 11 or a decrease in throughput caused by early switching to the second relative speed lower than the first relative speed. Thus, both the throughput and the maintainability of the mold can be achieved.

Second Embodiment

In the first embodiment described above, an imprint apparatus, which transfers a pattern of a mold to an imprint material by bringing the imprint material and the mold into contact with each other, has been described as one aspect of the forming apparatus. However, the present invention is also applicable to a planarization apparatus as another aspect of the forming apparatus, which brings a formable material (composition) on a substrate into contact with a member (mold) including a planarized surface to form a planarizing film made of the composition on the substrate.

The underlying pattern on the substrate has a concave/convex profile derived from a pattern formed in the previous step. More particularly, a process substrate may have a step of about 100 nm along with a multilayer structure of a recent memory element. The step derived from the moderate undulation of the entire surface of the substrate can be corrected by the focus tracking function of a scan exposure apparatus used in the photo process. However, the fine concave-convex portions having a pitch small enough to fall within the exposure slit area of the exposure apparatus may fall outside the DOF (Depth Of Focus) of the exposure apparatus. As a conventional method of planarizing the underlying pattern of the substrate, a method for forming a planarized layer, such as SOC (Spin On Carbon) or CMP (Chemical Mechanical Polishing) is used. However, the conventional technique undesirably cannot obtain sufficient planarization performance, and the concave/convex difference of the underlayer by multilayer formation tends to increase.

In order to solve this problem, studies have been conducted on a planarization apparatus that planarizes a substrate by using the above imprint technique. The planarization apparatus locally performs planarization within a substrate plane by bringing a planarized surface of a member or a member (flat template) on which no pattern is formed into contact with an uncured composition supplied to the substrate in advance. Subsequently, the composition is cured while the composition is in contact with the flat template, and the flat template is separated from the cured composition. This forms a planarized layer on the substrate. The planarization apparatus using the imprint technique is configured to drop a composition in drops in an amount corresponding to a stepped portion on a substrate, and hence is expected to improve the accuracy of planarization as compared with the existing methods.

In the planarization apparatus, a planarizing film is collectively formed on the entire surface of a substrate. At this time, the above-described embodiment is applicable to reduce protrusion and unfilling of a composition with respect to the substrate.

Embodiment of Article Manufacturing Method

An article manufacturing method according to an embodiment of the present invention is suitable for manufacturing an article such as a microdevice, for example a semiconductor device, or an element having a microstructure. The article manufacturing method according to this embodiment includes a step of forming, using the above-described forming apparatus, a formable material supplied (applied) onto a substrate, and a step of processing the substrate having undergone the forming step. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are a mold for imprint and the like.

The pattern of the cured product is directly used as the constituent member of at least some of the above-described articles or used temporarily as a resist mask. After etching or ion implantation is performed in the substrate processing step, the resist mask is removed.

The article manufacturing method will be described next. In step SA of FIG. 11, a substrate 1z such as a silicon substrate with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 11:
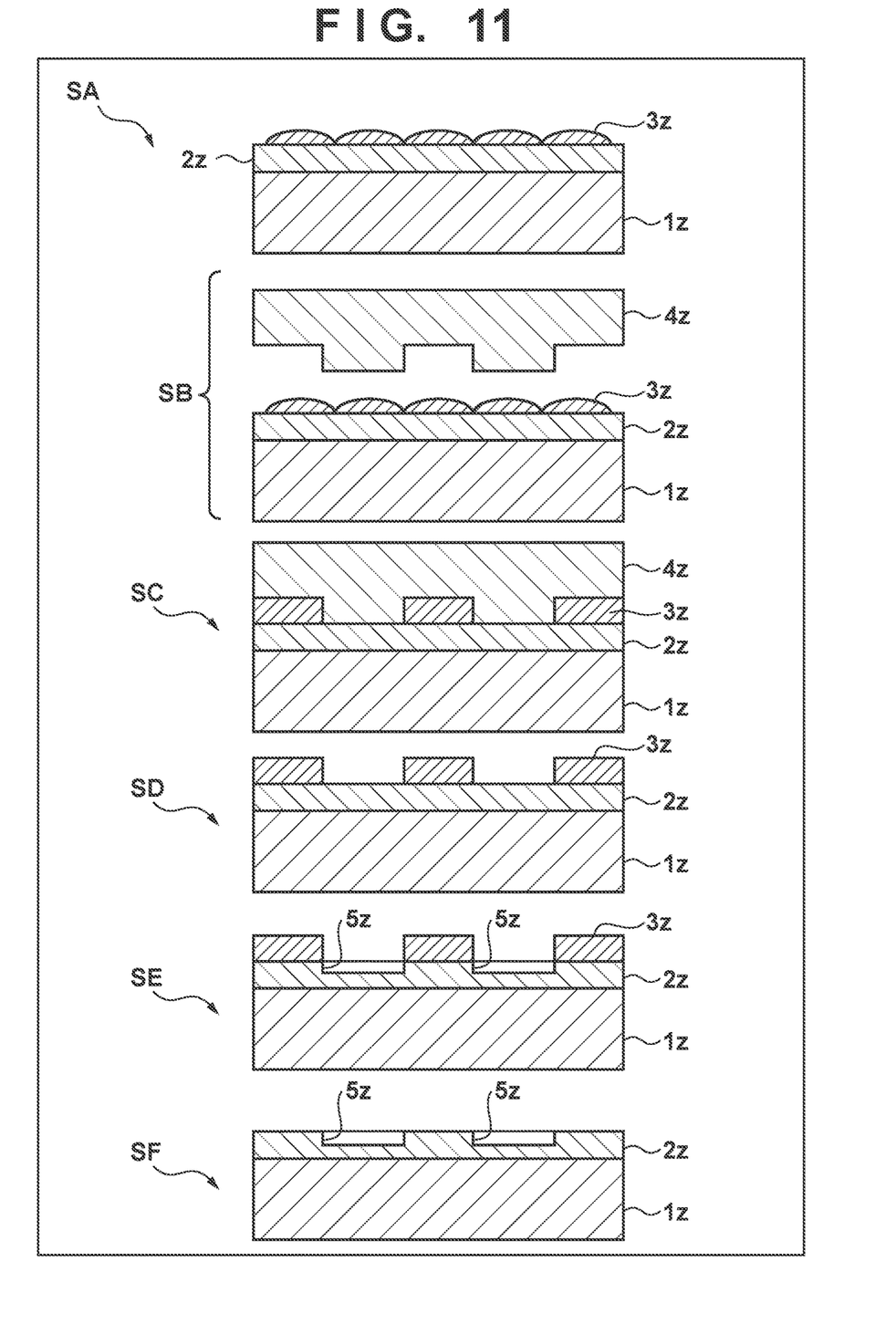
FIG. 11 is a view exemplarily showing an article manufacturing method.

In step SB of FIG. 11, a side of a mold 4z for imprint with a concave-convex pattern is directed toward and made to face the imprint material 3z on the substrate. In step SC of FIG. 11, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

In step SD of FIG. 11, after the imprint material 3z is cured, the mold 4z is separated from the substrate 1z, and then the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

In step SE of FIG. 11, when etching is performed using the pattern of the cured product as an etching resistant mold, a portion of the surface of the processed material 2z where the cured product does not exist or remains thin is removed to form a groove 5z. In step SF of FIG. 11, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Note that an example has been described in which a circuit pattern transfer mold provided with a concave-convex pattern is used as the mold 4z, but a mold (blank template) including a flat portion without a concave-convex pattern may be used. The blank template is used in a planarization apparatus (forming apparatus) that performs a planarization process (forming process) of forming a composition on a substrate to be planarized by the flat portion. The planarization process includes a step of curing the composition supplied on the substrate by light irradiation or heating in a state in which the composition is in contact with the flat portion of the blank template.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-079245, filed May 7, 2021, which is hereby incorporated by reference herein in its entirety.

What is claimed is:

1. A forming apparatus for forming a formable material using a mold including a contact region to be brought into contact with the formable material on a substrate, the apparatus comprising:
a mold holder configured to hold the mold;
a substrate holder configured to hold the substrate onto which the formable material has been supplied;
a measuring device configured to measure a height position of the contact region of the mold; and
a controller configured to perform processing of bringing the contact region and the formable material on the substrate into contact with each other, wherein the controller controls:
the processing so as to bring the mold holder and the substrate holder closer to each other at a first relative speed and then bring the mold holder and the substrate holder even closer to each other at a second relative speed lower than the first relative speed; and
switching from the first relative speed to the second relative speed, so as to compensate a manufacturing error of the mold, based on a difference between a first measured height position, which is measured by the measuring device, of the contact region of the mold and a second measured height position, which is measured by the measuring device, of a contact region of a reference mold whose manufacturing error is known.

2. The apparatus according to claim 1, further comprising:
a deforming device configured to deform the mold into a convex shape toward the substrate by applying a pressure to a space on an opposite side of the contact region of the mold,
wherein the controller performs the processing while controlling deformation of the mold by the deforming device.

3. The apparatus according to claim 1, wherein:
the contact region includes a pattern to be transferred to the formable material on the substrate, and
the forming apparatus is an imprint apparatus that brings the contact region of the mold and an imprint material serving as the formable material on the substrate into contact with each other to transfer the pattern to the imprint material.

4. The apparatus according to claim 1, wherein:
the contact region is a planarized surface, and
the forming apparatus is a planarization apparatus that forms a planarizing film made of the formable material on the substrate by bringing the planarized surface of the mold and the formable material on the substrate into contact with each other.

5. An article manufacturing method comprising:
forming a formable material on a substrate using the forming apparatus defined in claim 1; and
further processing the substrate having undergone the forming,
manufacturing an article from the substrate having undergone the further processing.

6. A forming apparatus for forming a formable material on a substrate using a mold including a contact region to be brought into contact with the formable material on the substrate, the apparatus comprising:
a mold holder configured to hold the mold;
a substrate holder configured to hold the substrate onto which the formable material has been supplied;
a measuring device configured to measure a height position of the contact region of the mold;
a deforming device configured to deform the mold into a convex shape toward the substrate by applying a pressure to a space on an opposite side of the contact region of the mold; and
a controller configured to perform processing of bringing the contact region and the formable material on the substrate into contact with each other, wherein the controller controls:
the processing, while controlling deformation of the mold with the deforming device, so as to bring the mold holder and the substrate holder closer to each other at a first relative speed and then bring the mold holder and the substrate holder even closer to each other at a second relative speed lower than the first relative speed; and
switching from the first relative speed to the second relative speed, so as to compensate a manufacturing error of the mold, based on a difference between a f first obtained deformation amount, which is obtained using the measuring device, of the mold deformed by the deforming device and a second obtained deformation amount, which is obtained using the measurement device, of a reference mold, whose manufacturing error is known, deformed by the deforming device.

7. The apparatus according to claim 6, wherein the controller controls the switching from the first relative speed to the second relative speed further based on a relationship obtained in advance between the pressure and the deformation amount by the deforming device for each of a plurality of molds.

* * * * *